US008039880B2

(12) United States Patent
Tayrani et al.

(10) Patent No.: US 8,039,880 B2
(45) Date of Patent: Oct. 18, 2011

(54) HIGH PERFORMANCE MICROWAVE SWITCHING DEVICES AND CIRCUITS

(75) Inventors: Reza Tayrani, Marina Del Rey, CA (US); Mary A. Teshiba, Torrance, CA (US)

(73) Assignee: Raytheon Company, Waltham, MA (US)

( * ) Notice: Subject to any disclaimer, the term of this patent is extended or adjusted under 35 U.S.C. 154(b) by 1484 days.

(21) Appl. No.: 11/225,423

(22) Filed: Sep. 13, 2005

(65) Prior Publication Data

US 2007/0058309 A1 Mar. 15, 2007

(51) Int. Cl.
*H01L 29/772* (2006.01)
*H01L 21/18* (2006.01)

(52) U.S. Cl. ......... 257/277; 257/E27.009; 257/E21.085; 327/382; 438/933

(58) Field of Classification Search .................. 327/382; 257/277, 531, 664, E27.009, E21.085; 438/933
See application file for complete search history.

(56) References Cited

U.S. PATENT DOCUMENTS

| | | | | |
|---|---|---|---|---|
| 4,535,304 | A * | 8/1985 | Bura | 330/300 |
| 5,221,908 | A * | 6/1993 | Katz et al. | 330/149 |
| 5,357,119 | A * | 10/1994 | Wang et al. | 257/18 |
| 5,546,049 | A * | 8/1996 | Wen et al. | 330/277 |
| 5,668,506 | A * | 9/1997 | Watanabe et al. | 331/66 |
| 6,426,683 | B1 * | 7/2002 | Gu et al. | 333/174 |
| 6,436,748 | B1 * | 8/2002 | Forbes et al. | 438/199 |
| 6,855,963 | B1 * | 2/2005 | Chu et al. | 257/103 |
| 2004/0129982 | A1 * | 7/2004 | Oda et al. | 257/369 |

OTHER PUBLICATIONS

Feng-Jung, et al, A 900 MHz T/R Switch with 0.8 -dB insertion loss implemented in 0.5 um CMOS process, IEEE 2000 custom integrated circuits.

Yamamoto, Kazuyz, et al, A 2.4 GHz band 8.8 v operation single chip Si CMOS T.R. MMIC front-end with a low insertion loss switch Aug. 2001, vol. 36, No. 8, IEEE JSSC.

Ohnakado, T., et al, A 1.4 dB insertion loss, 5.0 GHz transmit/receive switch utilizing novel depletion layer extended transistor (DETs) in 0.18 um CMOS process, 2002 IEEE Symposium on VLSI technology digest of papers.

* cited by examiner

*Primary Examiner* — Benjamin Sandvik
*Assistant Examiner* — Wensing Kuo
(74) *Attorney, Agent, or Firm* — Christie, Parker & Hale, LLP

(57) ABSTRACT

A switching circuit. The novel switching circuit includes an active device and a first circuit for providing a reactive inductive load in shunt with the active device. In an illustrative embodiment, the first circuit is implemented using a transmission line coupled between an output of the active device and ground, in parallel with the device, to minimize the parasitic effects of the device drain to source capacitance. In a preferred embodiment, the active device includes a silicon-germanium NFET optimized for operation at high frequencies (e.g. up to 20 GHz). The optimization process includes coupling a compact, low-parasitic polysilicon resistor to a gate of the NFET to provide gate RF isolation, and designing the gate manifold, drain manifold, and drain to source spacing of the NFET for optimal high frequency operation.

14 Claims, 4 Drawing Sheets

HIGH PERFORMANCE MICROWAVE SWITCHING DEVICES AND CIRCUITS

BACKGROUND OF THE INVENTION

1. Field of the Invention

The present invention relates to electrical and electronic circuits and systems. More specifically, the present invention relates to microwave switches.

2. Description of the Related Art

Microwave switches are used in a wide variety of applications such as communications and active phased array radar systems. For example, switches may be used to control the direction of a radio frequency (RF) or microwave signal or to provide phase and amplitude control functions in a transmit/receive (T/R) module.

Silicon-germanium (SiGe) technology permits the integration of advanced MMICs, low power VLSI digital electronics, and low frequency analog circuits in a single high yield process. The availability of several high performance microwave passive and active devices on the same wafer, including SiGe HBTs, MOS FETs, PINs, and Varactors, etc., render the SiGe technology a new and exciting paradigm for innovative circuit designs suitable for the realization of "system-on-chip" circuits.

In conventional microwave circuits, switches are commonly implemented using SiGe PIN diodes. However, PIN devices consume DC power and need complex bias supply circuits, both of which negatively impact system efficiency, prime power, size and thereby cost.

Switches implemented using SiGe NMOS devices consume little or no DC power, but are typically limited in bandwidth. For example, prior silicon (Si) based (0.18 um NMOS) RF switching devices offered by the IBM 7-HP process have a maximum useful frequency of less than 5 GHz. Above this frequency, unwanted parasitics associated with the NMOS device become a significant factor in rapidly detracting the switch performance.

Hence, a need exists in the art for an improved microwave switch offering lower power consumption and increased frequency range.

SUMMARY OF THE INVENTION

The need in the art is addressed by the switching circuit of the present invention. The novel switching circuit includes an active device and a first circuit for providing a reactive inductive load in shunt with the active device. In an illustrative embodiment, the first circuit is implemented using a transmission line coupled between an output of the active device and ground, in parallel with the device, to minimize the parasitic effects of the device drain to source capacitance. In a preferred embodiment, the active device includes a silicon-germanium n-channel field effect transistor (NFET) optimized for operation at high frequencies (e.g. up to 20 GHz). In the illustrative embodiment, the optimization process includes coupling a compact, low-parasitic polysilicon resistor to a gate of the NFET to provide gate RF isolation, and designing the gate manifold, drain manifold, and drain to source spacing of the NFET for optimal high frequency operation.

Figure 4:
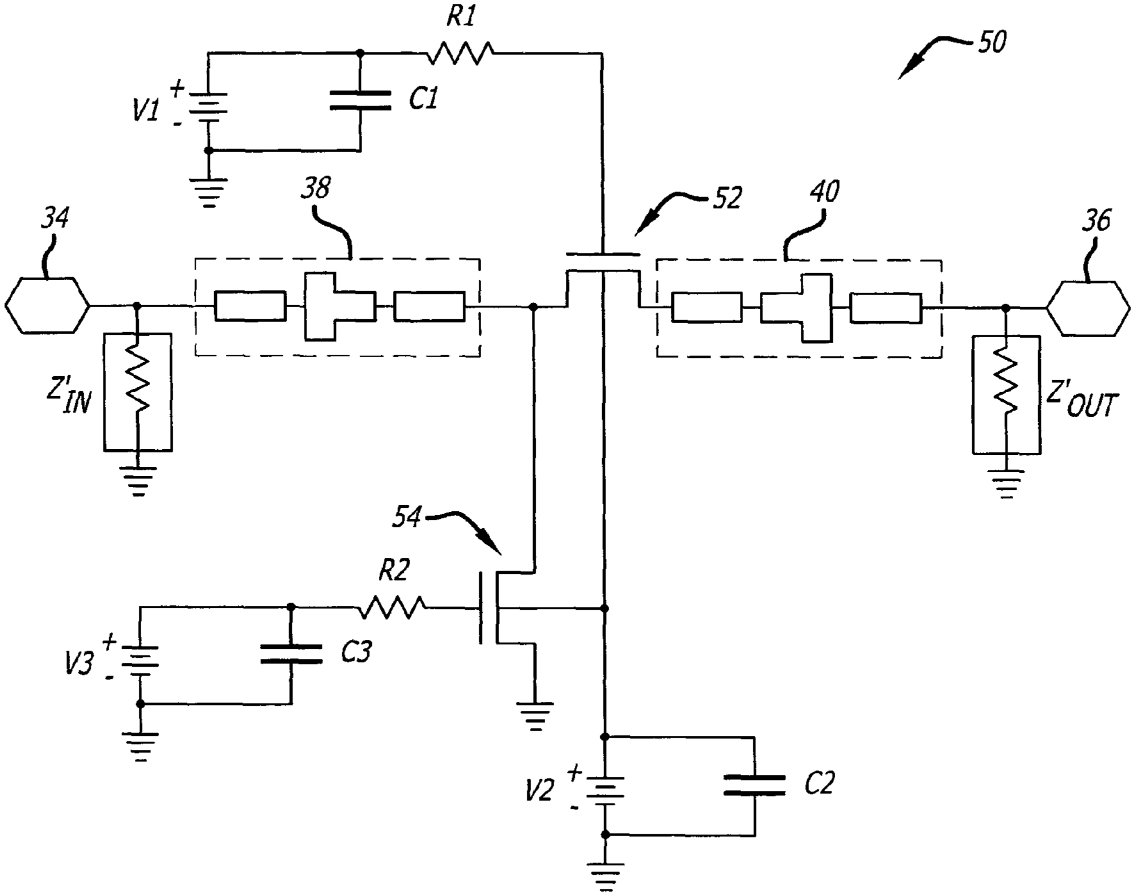
FIG. 4 is a simplified circuit model of an illustrative series-shunt embodiment of a switching device optimized for high frequency operation in accordance with the teachings of the present invention.

FIG. **5*a* is a layout of a parallel configuration implementation of the series-shunt switching device of FIG. 4**.

FIG. **5*b* is a layout of a 90 degree configuration implementation of the series-shunt switching device of FIG. 4**.

Figure 6:
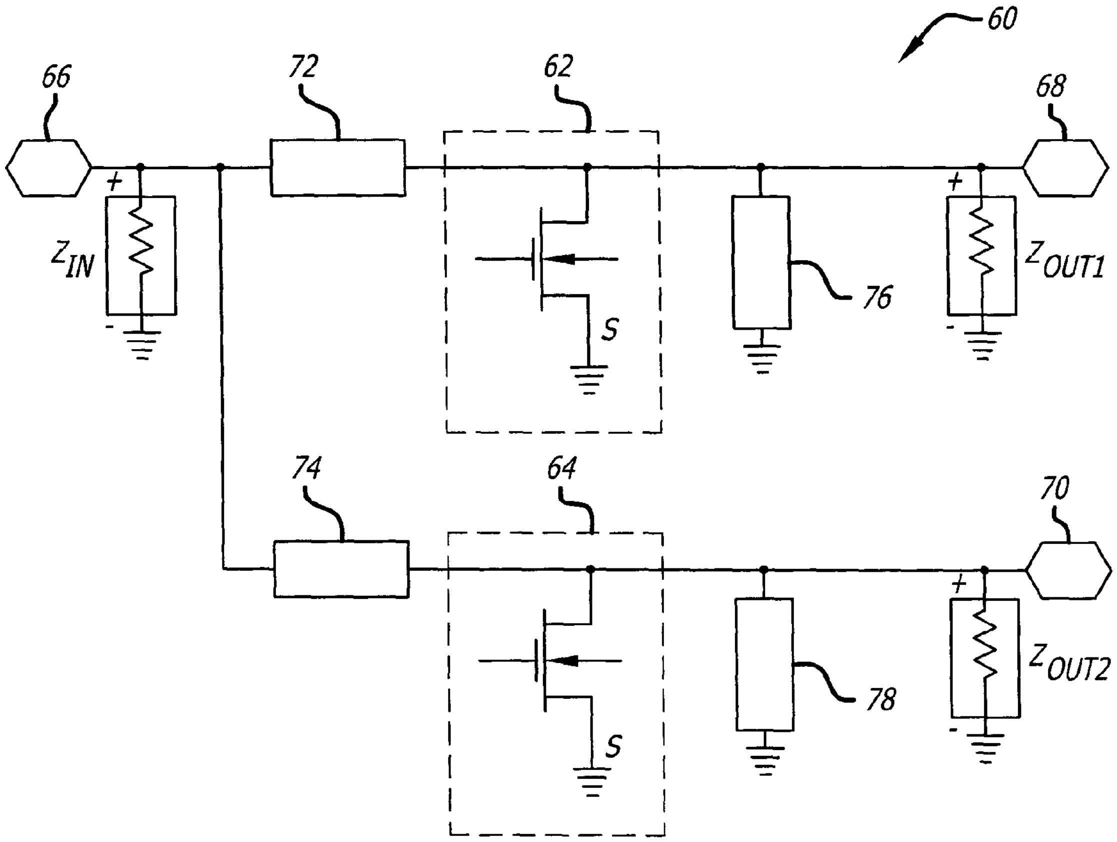

FIG. 6 is a simplified schematic diagram of an illustrative embodiment of a single pole double throw (SPDT) switching circuit designed in accordance with the teachings of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
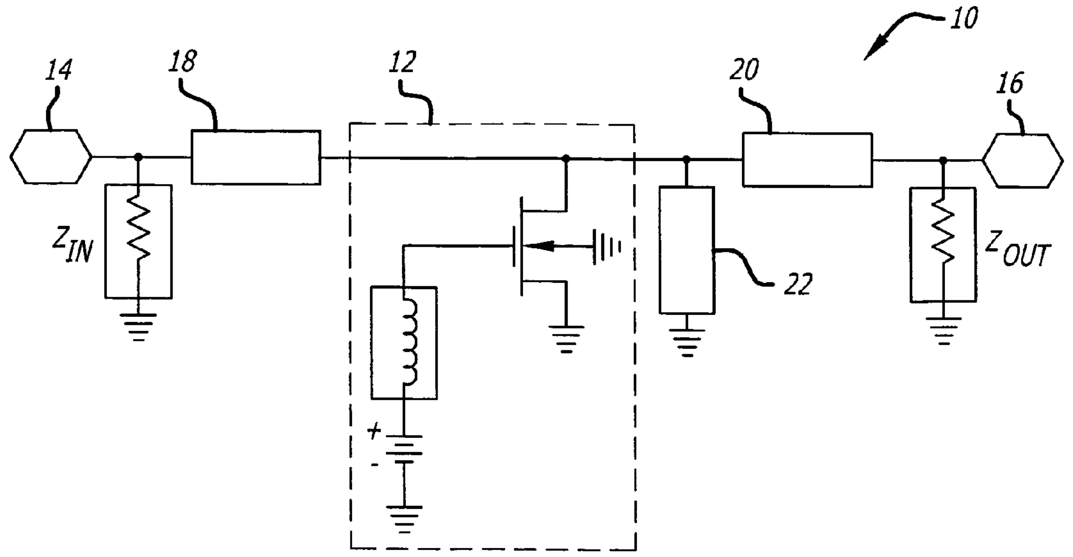
FIG. 1 is a simplified schematic diagram of an illustrative embodiment of a switching circuit designed in accordance with the teachings of the present invention.

FIG. 1 is a simplified schematic diagram of an illustrative embodiment of a switching circuit 10 designed in accordance with the teachings of the present invention. The switching circuit 10 includes a transistor or active device 12 coupled between an input terminal 14 having an impedance $Z_{IN}$ and an output terminal 16 having an impedance $Z_{OUT}$. In the illustrative embodiment, the transistor 12 is implemented using a SiGe NFET. The output (drain) of the transistor 12 is coupled to the input terminal 14 by a first transmission line 18, and to the output terminal 16 by a second transmission line 20. In accordance with the teachings of the present invention, an additional transmission line 22 is coupled between the output of the transistor 12 and ground, in shunt with the transistor 12, to provide a broadband resonator at the output of the device 12.

Inasmuch as capacitance of current large gate periphery SiGe NFETs (particularly 0.18 um devices) provides a low capacitive reactive impedance on the order of 50 ohms at around 20 GHz and beyond, it is useful to provide a suitable reactive inductive load in shunt with the device drain to source capacitance ($C_{ds}$) to increase the impedance at the device output reference plane and thereby minimize the switch insertion loss. The circuit shown in FIG. 1 shows an implementation of this idea by adding a suitable length of transmission line 22 in parallel with the NFET device 12 to minimize the parasitic effects of the device capacitance $C_{ds}$.

By this approach, the useful frequency range of the switch can be extended to 20 GHz. For example, the present teachings should provide good KU band switching performance over 15.0 to 17.0 GHz having an insertion loss of less than 1.0 dB and isolation of greater than 20 dB across the frequency band of interest. By adjusting the dimensions of the NFET device as well as the shunt distributed transmission line 22, it should be possible to move the center of the resonance frequency to high mm-wave frequencies.

Figure 2:
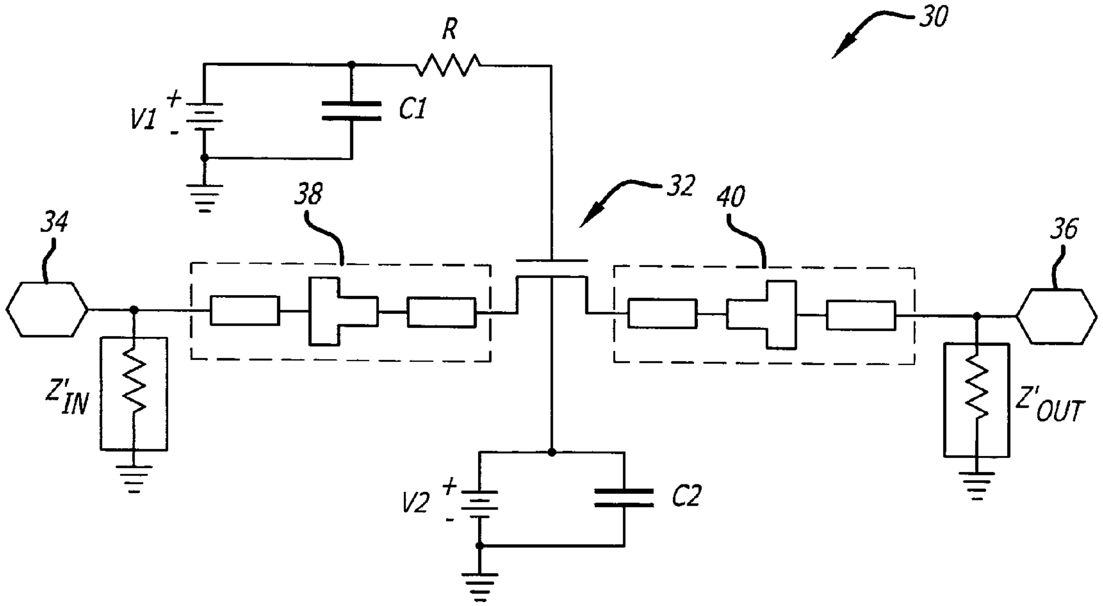
FIG. 2 is a simplified circuit model of an illustrative series embodiment of a switching device optimized for high frequency operation in accordance with the teachings of the present invention.

In a preferred embodiment, the active device 12 is implemented using an N-Channel-Metal-Oxide Semiconductor (NMOS) switching device optimized for high frequency operation. FIG. 2 is a simplified circuit model of an illustrative series embodiment of a switching device 30 optimized for high frequency operation in accordance with the teachings of the present invention. The switching device 30 includes an NFET 32 coupled between an input terminal 34 having an impedance $Z'_{IN}$ and an output terminal 36 having an impedance $Z'_{OUT}$. A first output (source) of the NFET 32 is coupled to the input terminal 34 by a transmission line 38, and a second output (drain) of the NFET 32 is coupled to the output terminal 36 by a transmission line 40.

In accordance with the teachings of the present invention, a compact, low-parasitic integrated resistor R is coupled to the gate of the device 32 to provide gate RF isolation and gate-tie-down configuration to minimize undesirable Si substrate effects at microwave frequencies. In an illustrative embodiment, the resistor R is a compact polysilicon resistor, and the value of the resistor R is designed to minimize parasitic contributions. The resistor R is connected between the gate of the device 32 and a voltage supply V1 having an associated capacitance C1.

In addition, the substrate (body) of the NFET 32 is coupled to a DC voltage V2 having a capacitance C2 to minimize the parasitics associated with the substrate and enhance the performance of the switch.

When designing the NFET 32, the parameters of the device can also be optimized for high frequency operation. In particular, the gate manifold, drain manifold, and drain to source spacing of the device contribute significantly to high frequency performance. In the preferred embodiment, these parameters are optimized during the design process to reduce the extrinsic parasitic elements of the device 32.

Figure 3:
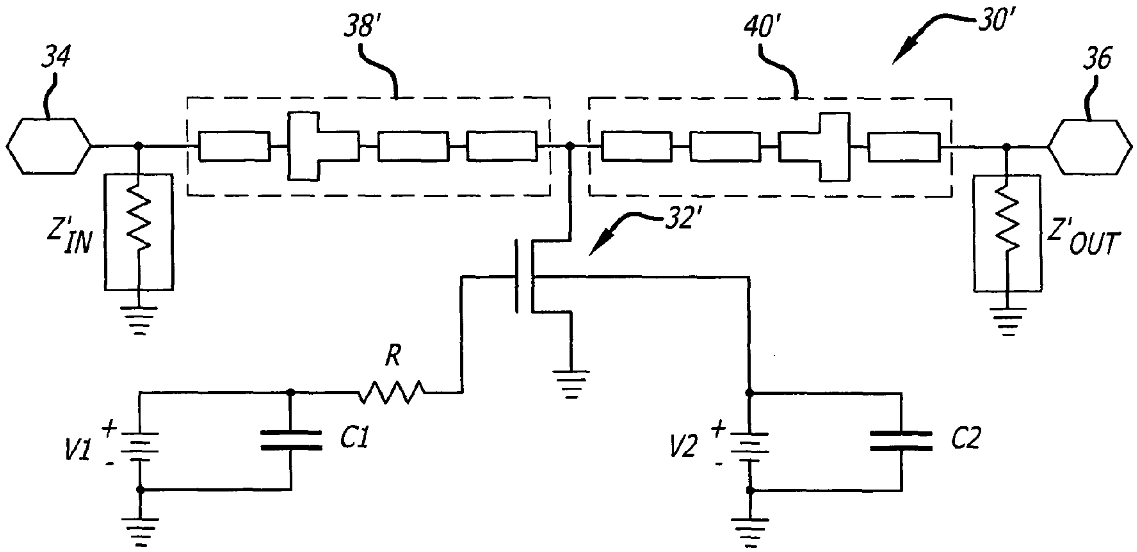
FIG. 3 is a simplified circuit model of an illustrative shunt embodiment of a switching device optimized for high frequency operation in accordance with the teachings of the present invention.

FIG. 3 is a simplified circuit model of an illustrative shunt embodiment of a switching device 30' optimized for high frequency operation in accordance with the teachings of the present invention. The switching device 30' includes an NFET 32' coupled between an input terminal 34 having an impedance $Z'_{IN}$ and an output terminal 36 having an impedance $Z'_{OUT}$. An output (drain) of the transistor 32' is coupled to the input terminal 34 by a transmission line 38', and to the output terminal 36 by a transmission line 40'. The source of the NFET 32' is coupled to ground.

In accordance with the teachings of the present invention, a compact polysilicon resistor R is coupled to the gate of the device 32' to provide gate RF isolation. The resistor R is connected between the gate of the device 32' and a voltage supply V1 having an associated capacitance C1. The substrate (body) of the NFET 32' is coupled to a DC voltage V2 having a capacitance C2.

FIG. 4 is a simplified circuit model of an illustrative series-shunt embodiment of a switching device 50 optimized for high frequency operation in accordance with the teachings of the present invention. The switching device 50 includes a first NFET 52 coupled between an input terminal 34 having an impedance $Z'_{IN}$ and an output terminal 36 having an impedance $Z'_{OUT}$. A first output (source) of the NFET 52 is coupled to the input terminal 34 by a transmission line 38, and a second output (drain) of the NFET 32 is coupled to the output terminal 36 by a transmission line 40. A compact polysilicon resistor R1 is coupled between the gate of the device 52 and a voltage supply V1 having an associated capacitance C1.

The switching device 50 also includes a second NFET 54 connected in shunt to the source of the first NFET 52. The drain of the shunt NFET 54 is coupled to the source of the series NFET 52 and the source of the shunt NFET 54 is coupled to ground. A compact polysilicon resistor R2 is coupled between the gate of the device 54 and a voltage supply V3 having an associated capacitance C3. The substrates of the devices 52 and 54 are coupled to a voltage supply V2 having a capacitance C2.

Figure 5A:
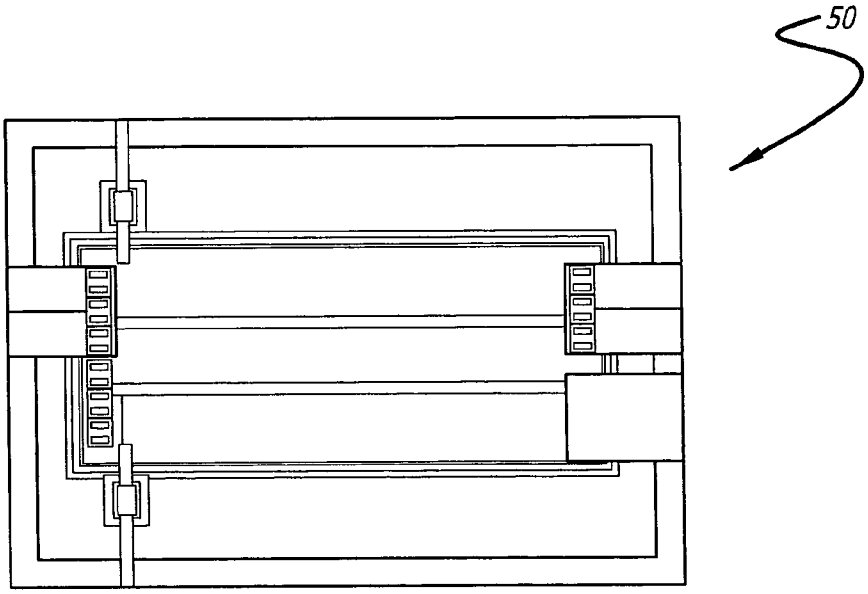
Figure 5B:
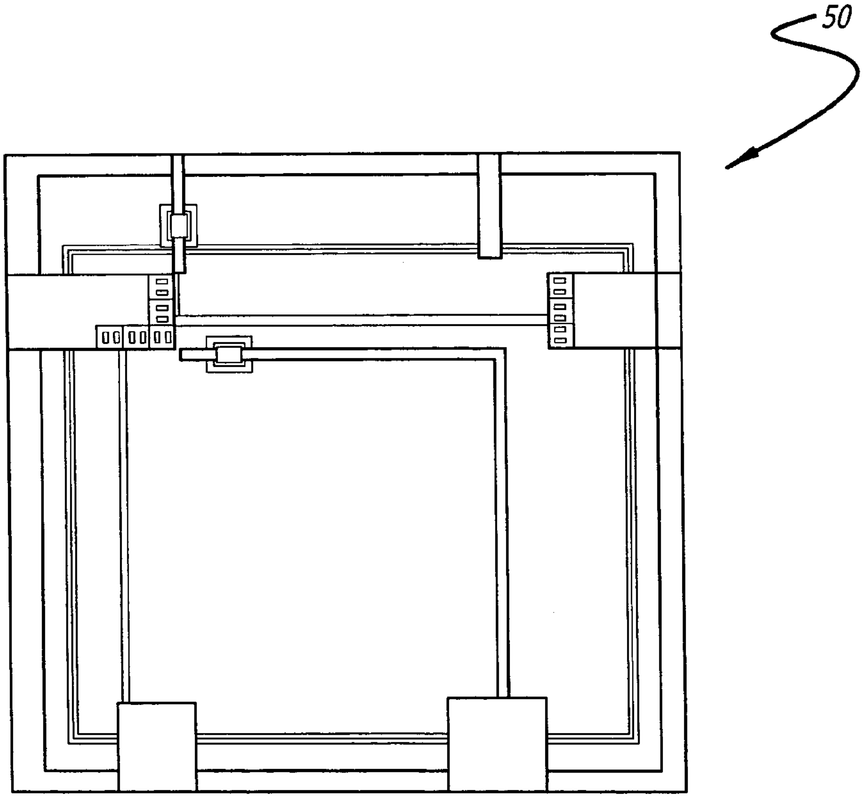

FIG. 5a is a layout of a parallel configuration implementation of the series-shunt switching device 50 of FIG. 4. FIG. 5b is a layout of a 90-degree configuration implementation of the series-shunt switching device 50 of FIG. 4.

By optimizing the parameters of the devices 52 and 54 as described above, and optimizing the interconnections between the two devices 52 and 54 to minimize parasitics, the series-shunt configuration shown in FIG. 4 provides a new integrated NFET switching device suitable for applications at X-band, KU-band and millimeter wave frequencies. The novel NFET switches should provide excellent symmetrical switching response at 10.0 GHz showing switching speeds of less than 1.0 nano-seconds for both turn-on and turn-off switching time. By combining the optimized switching devices of FIGS. 2-4 with the resonance switching circuit design of FIG. 1, the operational frequencies of an NMOS switch should be extended to 20 GHz with an insertion loss of less than 2.0 db and isolation of greater than 20 dB.

The switching circuits discussed above have been single pole single throw (SPST) switches. However, the invention is not limited thereto. The teachings of the present invention can also be applied to other switch configurations including multiple pole multiple throw switches. For example, FIG. 6 is a simplified schematic diagram of an illustrative embodiment of a single pole double throw (SPDT) switching circuit 60 designed in accordance with the teachings of the present invention.

The SPDT switch 60 includes two active devices 62 and 64. The first device 62 is coupled between an input terminal 60 having an impedance $Z_{IN}$ and a first output terminal 68 having an impedance $Z_{OUT1}$. The second device 64 is coupled between the input terminal 60 and a second output terminal 68 having an impedance $Z_{OUT2}$. The output (drain) of the first device 62 is coupled to the input terminal 60 by a transmission line 72, and to the output terminal 68. The output (drain) of the second device 64 is coupled to the input terminal 60 by a transmission line 74, and to the output terminal 70.

In accordance with the teachings of the present invention, a transmission line is connected to the output of each device to provide a reactive inductive load in shunt with the device drain to source capacitance. As shown in FIG. 6, a transmission line 76 is coupled to the output of the device 62, and a transmission line 78 is coupled to the output of the device 64. In a preferred embodiment, the active devices 62 and 64 are optimized for high frequency operation as described above for FIGS. 2-4.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A switching circuit comprising:

an active device comprising a silicon-germanium NFET; and a reactive inductive load in shunt with said active device, wherein said reactive inductive load comprises a transmission line coupled between an output of said active device and ground, and wherein said transmission line comprises a preselected length thereby minimizing the parasitic effects of the device drain to source capacitance, wherein the NFET comprises preselected dimensions, and wherein a preselected resonant frequency of the switching circuit is based on the preselected dimensions of the NFET.

2. The invention of claim 1 wherein said switching circuit is operable at frequencies up to 20 GHz.

3. The invention of claim 1 wherein said active device includes a compact resistor coupled to a gate of said NFET to provide gate RF isolation.

4. The invention of claim 3 wherein said resistor is fabricated from polysilicon.

5. The invention of claim 3 wherein said resistor is designed to minimize parasitic contributions.

6. The invention of claim 1 wherein said a substrate of said NFET is coupled to a DC voltage supply.

7. The invention of claim 1 wherein said active device is optimized for high frequency operation.

8. The invention of claim 7 wherein the gate manifold, drain manifold, and drain to source spacing of said active device are optimized for high frequency operation.

9. A method for extending the operational frequency of a switching circuit, the method comprising:

providing an active device comprising a silicon-germanium NFET; and providing a reactive inductive load in shunt with said active device to increase the impedance at the device output reference plane and minimize the switch insertion loss, wherein the reactive inductive load comprises a transmission line coupled between an output of said active device and ground, wherein said transmission line comprises a preselected length thereby minimizing the parasitic effects of the device drain to source capacitance, wherein the NFET comprises preselected dimensions, and wherein a preselected resonant frequency of the switching circuit is based on the preselected dimensions of the NFET.

10. The invention of claim 1 wherein the switching circuit is configured to provide a symmetrical switching response at a preselected frequency.

11. The invention of claim 1 wherein the switching circuit is a component of a phased array radar system.

12. The invention of claim 1 wherein the switching circuit is a component of a transmit/receive module of a phased array radar system.

13. The invention of claim 12 wherein the switching circuit is configured to provide phase and amplitude control.

14. The invention of claim 1, wherein the preselected resonant frequency of the switching circuit is based on the preselected dimensions of the NFET and the preselected length of the transmission line.

* * * * *